US008854114B2

(12) United States Patent
Tabata et al.

(10) Patent No.: US 8,854,114 B2
(45) Date of Patent: Oct. 7, 2014

(54) ANTENNA DRIVE APPARATUS

(71) Applicant: Aisin Seiki Kabushiki Kaisha, Kariya (JP)

(72) Inventors: Takehiro Tabata, Kariya (JP); Masahiro Hagimoto, Nagoya (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 0 days.

(21) Appl. No.: 13/937,592

(22) Filed: Jul. 9, 2013

(65) Prior Publication Data

US 2014/0015597 A1 Jan. 16, 2014

(30) Foreign Application Priority Data

Jul. 10, 2012 (JP) ................................. 2012-154421

(51) Int. Cl.
*H03K 17/96* (2006.01)
*H03K 17/945* (2006.01)
*H03K 3/01* (2006.01)
*G07C 9/00* (2006.01)

(52) U.S. Cl.
CPC .............. *H03K 3/01* (2013.01); *G07C 2209/65* (2013.01); *G07C 9/00309* (2013.01); *G07C 2009/00793* (2013.01)
USPC ........................................................ 327/517

(58) Field of Classification Search
None
See application file for complete search history.

(56) References Cited

U.S. PATENT DOCUMENTS

| 4,663,626 | A  | * | 5/1987  | Smith ........................... 340/12.5 |
| 7,102,487 | B2 | * | 9/2006  | Mafune et al. ................. 340/5.7 |
| 8,405,515 | B2 | * | 3/2013  | Ishihara et al. ............ 340/686.1 |
| 2007/0230201 | A1 |  | 10/2007 | Oba et al. |
| 2014/0022013 | A1 | * | 1/2014  | Tabata et al. ................. 330/251 |

FOREIGN PATENT DOCUMENTS

| JP | 2007-162246 A | 6/2007 |
| JP | 2009-084829 A | 4/2009 |
| JP | 2012-154118 A | 8/2012 |

* cited by examiner

*Primary Examiner* — Lincoln Donovan
*Assistant Examiner* — Terry L Englund
(74) *Attorney, Agent, or Firm* — Sughrue Mion, PLLC

(57) ABSTRACT

An antenna drive apparatus having a drive control unit and an antenna connected to the drive control unit via first and second connecting lines, and driven by an AC signal at a first resonant frequency, includes: a first driven member connected to the drive control unit via the connecting lines and driven by the AC signal at a second resonant frequency; a sensing member connected to the drive control unit via the connecting lines and driven by a DC signal, capable of sensing approach or contact of a person and, outputting a sensing signal indicating the fact that the approach or the contact has been sensed to the drive control unit via the first connecting line; and a stop mechanism configured to stop a function of the sensing member when the AC signal supplied to the antenna or the first driven member is sensed.

3 Claims, 7 Drawing Sheets

FIG.5

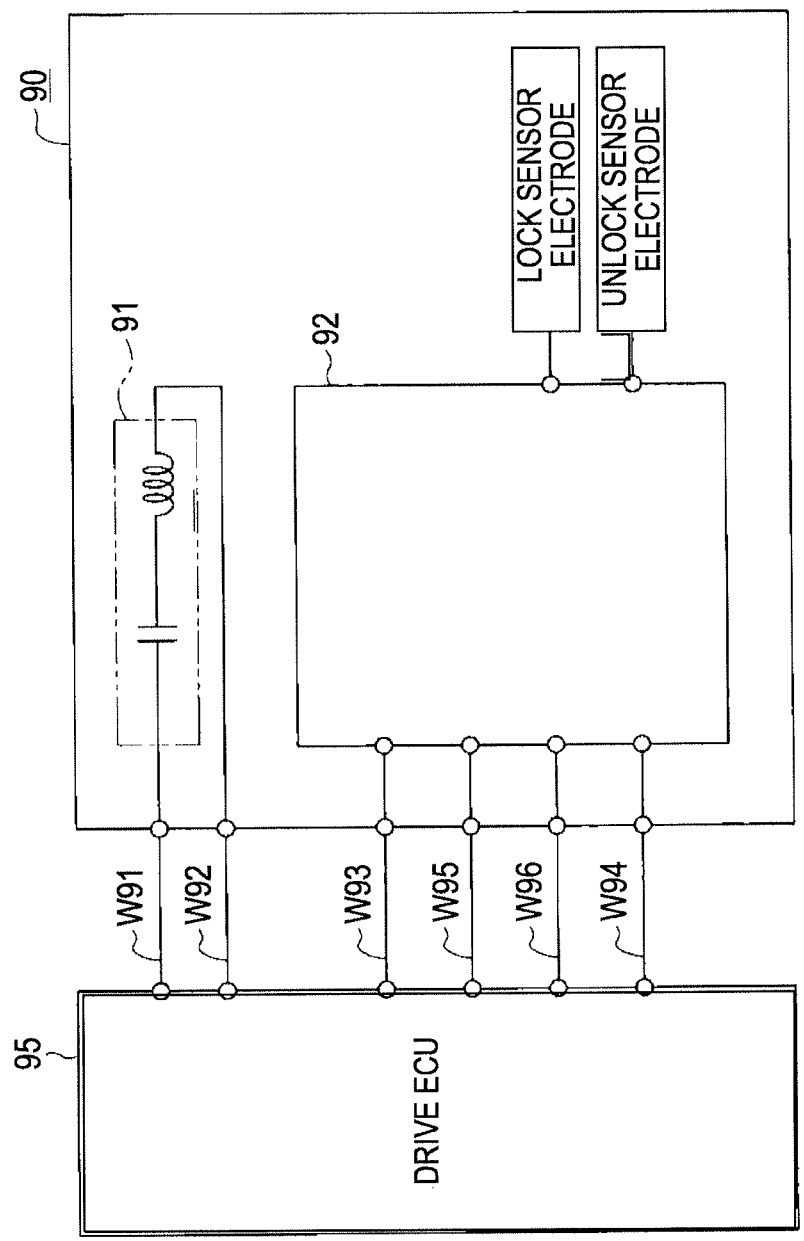

ANTENNA DRIVE APPARATUS

CROSS REFERENCE TO RELATED APPLICATIONS

This application is based on and claims priority under 35 U.S.C. §119 to Japanese Patent Application 2012-154421, filed on Jul. 10, 2012, the entire content of which is incorporated herein by reference.

TECHNICAL FIELD

This disclosure relates to an antenna drive apparatus configured to drive an antenna for transmission.

BACKGROUND DISCUSSION

In the related art, for example, an apparatus disclosed, in JP 2009-84829A (Reference 1), is known as an antenna drive apparatus. The antenna drive apparatus is configured to activate four switching elements constituting a full-bridge circuit (H-bridge circuit) by a drive circuit of a drive control unit (drive ECU) to perform a switching operation to generate an AC signal of a predetermined frequency and supply a resonant frequency corresponding to the above-described frequency to an antenna. There is proposed to equalize impedance values at two analogue circuit portions disposed with respect to both electric wires of a wire harness electrically connecting the drive control unit and the antenna for suppressing a leak or the like of an electromagnetic wave from the wire harness.

In JP 2009-84829A (Reference 1), there is no description about driving of members other than the antenna by the drive control unit. However, it is desired to also drive a sensing member by the drive control unit for sensing approach or contact of a person.

In other words, as illustrated in FIG. 7, a sensing member 92 is mounted on a driven control unit 90 on which an antenna 91 is mounted. Then, a drive ECU 95 as the drive control unit and the driven control unit 90 are electrically connected by a pair of electric wires W91 and W92 for supplying an AC signal to the antenna 91. The drive ECU 95 and the driven control unit 90 are also electrically connected by a pair of electric wires W93 and W94 for supplying a DC signal to the sensing member 92. Furthermore, the drive ECU 95 and the driven control unit 90 are electrically connected by a pair of electric wires W95 and W96 for outputting a sensing signal (here, a lock sensing signal and an unlock sensing signal) indicating sensing of approach or contact of a person to the drive ECU 95.

In this case, six electric wires W91 to W96 connecting the drive ECU 95 and the driven control unit 90 are required and hence increase in size and weight as an entire apparatus is inevitable.

In JP 2007-162246A (Reference 2), a drive control unit (vehicle-mounted controller) and an antenna and a sensing member (touch sensor) are electrically connected via a common electric wire (connecting line) and setting resonant frequencies of the antenna and the sensing member to be values different from each other, whereby the antenna or the sensing member may be selectively driven. However, in JP 2007-162246A (Reference 2), even though the method of sensing the approach or contact of a person in association with driving of the sensing member is indicated, an electrical configuration for outputting a sensing signal which indicates the fact that the approach or the contact has been sensed to the drive control unit is not described. In other words, it is estimated that an electric wire for outputting the sensing signal of the sensing member to the drive control unit is additionally required.

Therefore, providing two electric wires (connecting lines) for connecting the drive ECU 95 and the driven control unit 90 and using these two electric wires commonly for power supply to the antenna 91 and power supply to and output from the sensing signal of the sensing member 92 are reviewed. However, when the sensing signal is output when the antenna 91 is being driven, for example, there is a probability of erroneous sensing at the drive ECU 95 due to an AC signal superimposed with the sensing signal. In addition, if the sensing performance of the sensing member 92 itself is deteriorated under the influence of an electromagnetic field when driving the antenna 91, reliability of the sensing signal is lowered accordingly.

A need thus exists for an antenna drive apparatus capable of reducing the number of connecting lines with respect to a drive control unit without impairing reliability of a sensing member configured to sense approach or contact of a person.

SUMMARY

An aspect of this disclosure is directed to an antenna drive apparatus having a drive control unit and an antenna electrically connected to the drive control unit via a first connecting line and via a second connecting line, and driven by an AC signal supplied from the drive control unit at a first resonant frequency, including: a first driven member electrically connected to the drive control unit via the first connecting line and via the second connecting line in parallel with the antenna and driven by an AC signal supplied from the drive control unit at a second resonant frequency different from the first resonant frequency; a sensing member electrically connected to the drive control unit via the first connecting line and via the second connecting line in parallel with the antenna and driven by a DC signal supplied from the drive control unit, the sensing member being capable of sensing approach or contact of a person and configured to output a sensing signal indicating the fact that the approach or the contact has been sensed to the drive control unit via the first connecting line; and a stop mechanism configured to stop a function of the sensing member when an AC signal supplied to the antenna or the first driven member is sensed.

In this configuration, the antenna is driven by the AC signal having the first resonant frequency supplied from the drive control unit via the first connecting line and via the second connecting line. At this time, although the AC signal having the first resonant frequency is supplied also to the first driven member from the drive control unit via the first connecting line and via the second connecting line, since the first resonant frequency is different from the second resonant frequency, the first driven member is prevented from being driven.

In contrast, the first driven member is driven by the AC signal having the second resonant frequency supplied from the drive control unit via the first connecting line and via the second connecting line. At this time, although the AC signal having the second resonant frequency is supplied also to the antenna from the drive control unit via the first connecting line and via the second connecting line, since the second resonant frequency is different from the first resonant frequency, the antenna is prevented from being driven.

The sensing member is driven by the DC signal supplied from the drive control unit via the first connecting line and via the second connecting line, and is capable of sensing approach or contact of a person. The sensing member outputs the sensing signal indicating the fact that the approach or the contact has been sensed to the drive control unit via the first connecting line. However, when the AC signal to be supplied to the antenna or the first driven member is sensed, the function of the sensing member is stopped by the stop mechanism. Therefore, the sensing member does not perform a sensing action at the same time when the antenna or the first driven member is driven. In addition, since the sensing member does not output the sensing signal when the antenna or the first driven member is driven, the probability of erroneous sensing or the like by the sensing signal being superimposed with the first connecting line is reduced.

When the DC signal is supplied to the sensing member, the DC signal is supplied also to the antenna and the first driven member. However, the DC signal is cut in the respective resonant circuits (capacitors), and hence the antenna and the first driven member are not driven.

In this manner, even though the number of the connecting lines with respect to the drive control unit is reduced, each of the antenna, the first driven member, and the sensing member may be operated adequately. Then, since the number of the electric wires for electrically connecting with the drive control unit can be reduced, reduction in size and weight as an entire apparatus is achieved correspondingly.

BRIEF DESCRIPTION OF THE DRAWINGS

The foregoing and additional features and characteristics of this disclosure will become more apparent from the following detailed description considered with the reference to the accompanying drawings, wherein:

FIG. 5 is a circuit block diagram illustrating an electrical configuration of a modification of the embodiment disclosed here;

FIG. 7 is a circuit block diagram illustrating an electrical configuration of the related art.

DETAILED DESCRIPTION

An antenna drive apparatus of a smart entry system (registered trademark) configured to lock and unlock a vehicle door via a wireless communication with respect to a mobile unit carried by a vehicle user according to an embodiment disclosed here will be described.

Figure 1:
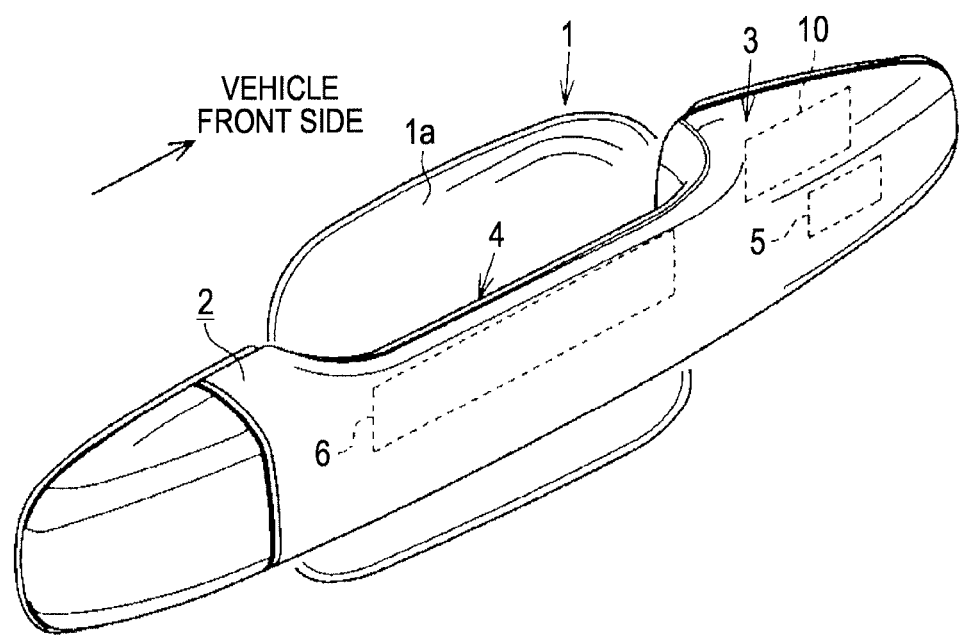
FIG. 1 is a perspective view illustrating an outside door handle.

As illustrated in FIG. 1, an door outer panel 1 which constitutes the vehicle door is provided with an outside door handle 2. The outside door handle 2 extends in the fore-and-aft direction of the vehicle, and is attached to the door outer panel 1 at two positions on the front and rear. The door outer panel 1 is formed with an inward depression 1a so as to face the outside door handle 2. This is for allowing a person to grip the outside door handle 2 easily near a center thereof with his or her hand.

The outside door handle 2 is molded into a hollow shape having an internal space by using, for example, a resin material. The outside door handle 2 is provided with a sensing area which is capable of sensing approach or contact of a person on an outer wall surface thereof. In other words, the outside door handle 2 is provided with a lock sensing area 3 which is capable of sensing the approach or contact of a person's hand intended to lock the vehicle door on the outer wall surface toward the front of the vehicle. In other words, the outside door handle 2 is provided with an unlock sensing area 4 which is capable of sensing the approach or contact of a person's hand intended to unlock the vehicle door on the outer wall surface in the middle part thereof, which serves as a gripping portion. A substantially rectangular plate-shaped lock sensor electrode 5 formed of a metallic plate, for example, is stored in the interior of the outside door handle 2 so as to be aligned with the lock sensing area 3 near the front surface away from the door outer panel 1, and a substantially rectangular plate-shaped unlock sensor electrode 6 formed of a metallic plate, for example, is stored so as to be aligned with the unlock sensing area 4 near the door outer panel 1. The unlock sensor electrode 6 is formed to be larger than the lock sensor electrode 5.

A module 10 electrically connected to the lock sensor electrode 5 and the unlock sensor electrode 6 is stored in the outside door handle 2.

Figure 2:
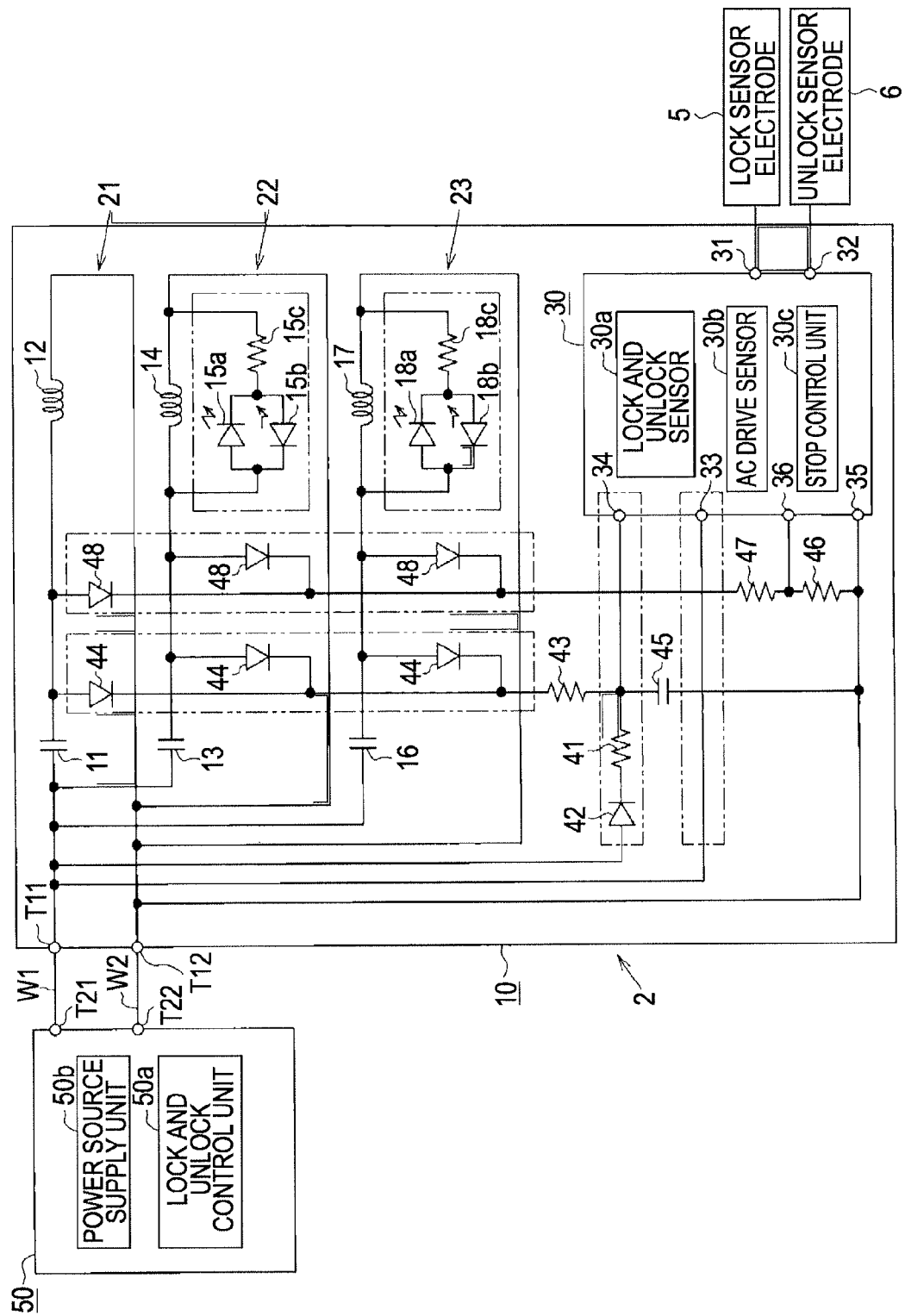
FIG. 2 is a circuit block diagram illustrating an electrical configuration of an embodiment disclosed here.

Subsequently, an electrical configuration of the embodiment disclosed here will be described. As illustrated in FIG. 2, the antenna drive apparatus includes the lock sensor electrode 5, the unlock sensor electrode 6, the module 10, and the drive ECU 50 as a drive control unit. The module 10 is connected to one end of a first electric wire W1 as a first connecting line at a first module side terminal T11, and the other end of the first electric wire W1 is connected to a first control unit side terminal T21 of the drive ECU 50. The module 10 is connected to one end of a second electric wire W2 as a second connecting line at a second module side terminal T12, and the other end of the second electric wire W2 is connected to a second control unit side terminal T22 of the drive ECU 50. In other words, the module 10 and the drive ECU 50 are connected by two wires including the first and second electric wires W1 and W2.

The module 10 is provided with an antenna resonant capacitor 11 connected at one end thereof to the first module side terminal T11, and an antenna coil 12 connected at one end thereof to the other end of the antenna resonant capacitor 11. The other end of the antenna coil 12 is connected to the second module side terminal T12. The antenna resonant capacitor 11 and the antenna coil 12 constitute an LF antenna 21, and constitute an LC series resonant circuit having a resonant frequency f1 as a first resonant frequency. Therefore, when an AC signal having a frequency coincident with the resonant frequency f1 is supplied from the drive ECU 50 via the first and second electric wires W1 and W2, the antenna coil 12 is driven and a wireless signal is output from the antenna coil 12. The wireless signal is, for example, an inquiry signal (request signal) to a mobile unit carried by a vehicle user, and the mobile unit having received the inquiry signal transmits a signal having an inherent ID code.

The module 10 is provided with a first LED capacitor 13 connected at one end thereof to the first module side terminal T11, and a first LED coil 14 connected at one end thereof to the other end of the first LED capacitor 13. The other end of the first LED coil 14 is connected to the second module side terminal T12. The first LED capacitor 13 and the first LED coil 14 constitute an LD series resonant circuit having a resonant frequency f2 as a second resonant frequency. An anode of an LED 15a and a cathode of an LED 15b are connected to one end of the first LED coil 14, and a cathode of the LED 15a and an anode of the LED 15b are connected to the other end of the first LED coil 14 via a resistance 15c. Therefore, when an AC signal having a frequency coincident with the resonant frequency f2 is supplied from the drive ECU 50 via the first and second electric wires W1 and W2, either one of the LEDs 15a and 15b is driven and turned ON so as to match the polarity of the AC current flowing in the first LED coil 14. In other words, the LEDs 15a and 15b are driven by using a resonant current of the LC series resonant circuit composed of the first LED capacitor 13 and the first LED coil 14. The LEDs 15a and 15b constitute a first driven member 22 together with the first LED capacitor 13 and the first LED coil 14 or the like.

The module 10 is provided with a second LED capacitor 16 connected at one end thereof to the first module side terminal T11, and a second LED coil 17 connected at one end thereof to the other end of the second LED capacitor 16. The other end of the second LED coil 17 is connected to the second module side terminal T12. The second LED capacitor 16 and the second LED coil 17 constitute an LC series resonant circuit having a resonant frequency f3 as a third resonant frequency. An anode of an LED 18a and a cathode of an LED 18b are connected to one end of the second LED coil 17, and a cathode of the LED 18a and an anode of the LED 18b are connected to the other end of the second LED coil 17 via a resistance 18c. Therefore, when an AC signal having a frequency coincident with the resonant frequency f3 is supplied from the drive ECU 50 via the first and second electric wires W1 and W2, either one of the LEDs 18a and 18b is driven and turned ON so as to match the polarity of the AC current flowing in the second LED coil 17. In other words, the LEDs 18a and 18b are driven by using a resonant current of the LC series resonant circuit composed of the second LED capacitor 16 and the second LED coil 17. The LEDs 18a and 18b constitute a second driven member 23 together with the second LED capacitor 16 and the second LED coil 17.

The resonant frequencies f1 and f3 are set to frequencies different from each other. For example, the resonant frequencies f1 to f3 are set to be frequencies which is lower in this order. The resonant frequencies f2 and f3, being set to frequencies such that resonant systems of the driven member may be separated from each other, may prevent simultaneous activation such that one LED is slightly turned ON while the other LED is ON.

The module 10 is provided with a sensor IC 30 as a sensing member. The sensor IC 30 is connected at a lock sensing input terminal 31 and an unlock sensing input terminal 32 to the lock sensor electrode 5 and the unlock sensor electrode 6 respectively, and is connected at a sensing signal output terminal 33 to the first module side terminal T11.

The sensor IC 30 includes a lock and unlock sensor 30a which constitutes a known electrostatic capacitance type sensor or the like together with the lock sensor electrode 5 and the unlock sensor electrode 6, and power is supplied by the lock and unlock sensor 30a to the lock sensor electrode 5 and the unlock sensor electrode 6 via the lock sensing input terminal 31 and the unlock sensing input terminal 32. The lock and unlock sensor 30a senses approach or contact of a person's hand to the lock sensing area 3 or the unlock sensing area 4 by detecting variations in electrostatic capacitance of the lock sensor electrode 5 and the unlock sensor electrode 6 each with respect to the door outer panel 1. The lock and unlock sensor 30a outputs a lock sensing signal or an unlock sensing signal as a sensing signal which indicates the fact that the approach or the contact has been sensed from the sensing signal output terminal 33 to the first module side terminal T11 (first electric wire W1). More specifically, the lock and unlock sensor 30a includes known switching means, and, for example, generates and outputs pulsed signals which are turned ON and OFF at cycles different from each other as the lock sensing signal and the unlock sensing signal.

The sensor IC 30 is connected to one end of a resistance 41 at a power source terminal 34, and the other end of the resistance 41 is connected to a cathode of a diode 42 for protecting IC, and an anode of the diode 42 is connected to the first module side terminal T11. The sensor IC 30 is connected to the second module side terminal T12 at a ground terminal 35. Therefore, the sensor IC 30 is driven by a DC signal supplied from the drive ECU 50 to the power source terminal 34 and the ground terminal 35 via the first and second electric wires W1 and W2.

Furthermore, the sensor IC 30 is connected to one end of a resistance 43 at the power source terminal 34, and the other end of the resistance 43 is connected to each cathode of three diodes 44. Anodes of the diodes 44 are connected to the first module side terminal T11 via the antenna resonant capacitor 11, the first LED capacitor 13, and the second LED capacitor 16, respectively. Then, a smoothing capacitor 45 is connected between the power source terminal 34 and the ground terminal 35. Therefore, when an AC signal having a frequency coincident with any one of the resonant frequencies f1 to f3 is supplied to the sensor IC 30 from the drive ECU 50 via the first and second electric wires W1 and W2, (that is, when any one of the antenna coil 12, the LEDs 15a and 15b, and the LEDs 18a and 18b is driven), the sensor IC 30 is driven by a current rectified by the corresponding diode 44, smoothened in the capacitor 45 and supplied to the power source terminal 34 and the ground terminal 35 as a DC signal.

The sensor IC 30 is connected to one end of a voltage dividing resistance 46 at an AC drive sensing terminal 36 and the other end of the voltage dividing resistance 46 is connected to the ground terminal 35. The sensor IC 30 is connected to one end of a voltage dividing resistance 47 at the AC drive sensing terminal 36 and the other end of the voltage dividing resistance 47 is connected to each cathode of three diodes 48. Anodes of the diodes 48 are connected to the first module side terminal T11 via the antenna resonant capacitor 11, the first LED capacitor 13, and the second LED capacitor 16, respectively. Therefore, when an AC signal having a frequency coincident with any one of the resonant frequencies f1 to f3 is supplied to the sensor IC 30 from the drive ECU 50 via the first and second electric wires W1 and W2, (that is, when any one of the antenna coil 12, the LEDs 15a and 15b, and the LEDs 18a and 18b is driven), a voltage rectified by the corresponding diode 48, and divided by the voltage dividing resistances 46 and 47 is supplied to the AC drive sensing terminal 36.

The sensor IC 30 has an AC drive sensor 30b, and senses the voltage divided by the voltage dividing resistances 46 and 47 by the AC drive sensor 30b. Then, the AC drive sensor 30b determines whether or not either one of the antenna coil 12, the LEDs 15a and 15b, and the LEDs 18a and 18b is in a state of being driven (whether or not either one of the LF antenna 21, the driven member 22, and the driven member 23 is in a state of being in AC driving) on the basis of a level (effective value) of the voltage divided by the voltage dividing resistances 46 and 47. Specifically, the AC drive sensor 30b includes, for example, a comparator or the like, and determines that one of the antenna coil 12, the LEDs 15a and 15b, and the LEDs 18a and 18b is in a state of being driven when the level of the voltage exceeds a threshold value set in advance.

The sensor IC 30 includes a stop control unit 30c as a stop mechanism, and acquires the result of determination in the AC drive sensor 30b by the stop control unit 30c. Then, the stop control unit 30c stops a function of the sensor IC 30 when any one of the antenna coil 12, the LEDs 15a and 15b, and the LEDs 18a and 18b is determined to be in a state of being driven. Specifically, the stop control unit 30c transmits a stop command to the lock and unlock sensor 30a, and stops an output of the sensing signal from the sensing signal output terminal 33. Alternatively, the stop control unit 30c may stop a power supply to the lock sensor electrode 5 and the unlock sensor electrode 6 by the lock and unlock sensor 30a. Alternatively, the stop control unit 30c may stop the entire function of the lock and unlock sensor 30a.

Needless to say, when none of the antenna coil 12, the LEDs 15a and 15b, and the LEDs 18a and 18b is determined to be in a state of being driven by the AC drive sensor 30b, the stop control unit 30c cancels the stop of the function of the sensor IC 30.

In contrast, the drive ECU 50 is mainly composed of, for example, a microcomputer, and includes a lock and unlock control unit 50a and a power source supply unit 50b. The lock and unlock control unit 50a issues a vehicle door lock command by receiving an input of a lock sensing signal from the first control unit side terminal T21 via the first electric wire W1 and also issues a vehicle door unlock command by receiving an input of an unlock sensing signal.

Figure 3:
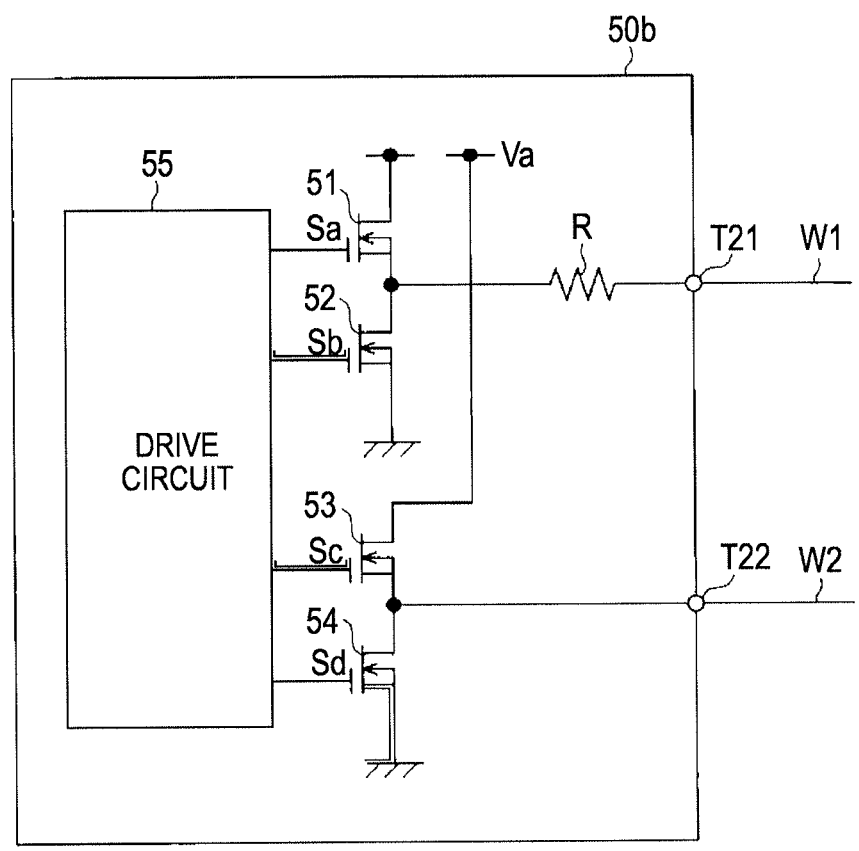
FIG. 3 is a circuit block diagram illustrating an electrical configuration of the same embodiment disclosed here.

The power source supply unit 50b includes four switching elements 51, 52, 53, and 54 each composed, for example, of an nMOS transistor, and a drive circuit 55 for activating the switching elements 51 to 54 to perform a switching action as illustrated in FIG. 3.

The switching element 51 is connected at the drain thereof to the battery Va and at a source thereof to a drain of the switching element 52, and at a gate thereof to the drive circuit 55. The switching element 52 is grounded at a source thereof and is connected at a gate thereof to the drive circuit 55. A drain of the switching element 52 (and the source of the switching element 51) is connected to the first control unit side terminal T21 via a resistance R.

In the same manner, the switching element 53 is connected at its drain to the battery Va and at the source thereof to a drain of the switching element 54, and at the gate thereof to the drive circuit 55. The switching element 54 is grounded at a source thereof and is connected at a gate thereof to the drive circuit 55. A drain of the switching element 54 (and the source of the switching element 53) is connected to the second control unit side terminal T22.

The switching elements 51 to 54 constitute a so-called H-bridge circuit, and are each configured to generate an AC signal or a DC signal by performing the switching action in accordance with drive signals Sa, Sb, Sc, and Sd output from the drive circuit 55, and output and supplies the same to the module 10 via the first and second electric wires W1 and W2.

Figure 4A:
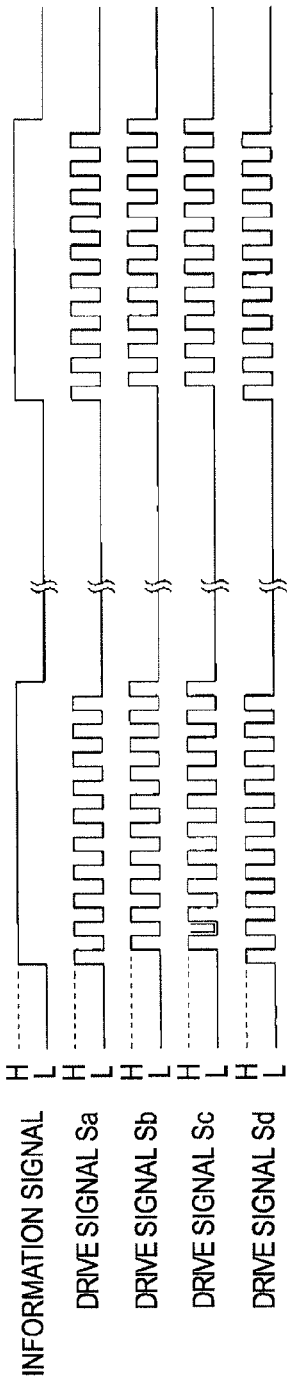
FIG. 4A is a time chart illustrating an information signal and drive signals.

For example, when the antenna coil 12 is driven, as illustrated in FIG. 4(a), the drive signal Sa and Sd repeat ON and OFF in a pulsed manner at a frequency coincident with the resonant frequency f1 during a ON period of an information signal which is turned ON and OFF (switched between a H (high) level and a L (low) level) at frequencies sufficiently lower than the resonant frequency f1, and the drive signal Sb and Sc repeat ON and OFF in a pulsed manner so as to be an opposite polarity to that of the drive signal Sa and Sd at the frequency coincident with the resonant frequency f1. Therefore, it is assumed that the drive signal Sa and Sd are in the ON state and the drive signal Sb and Sc are in the OFF state. In this case, the first electric wire W1 connected to the first control unit side terminal T21 is connected to the battery Va via the resistance R and the switching element 51, and the second electric wire W2 connected to the second control unit side terminal T22 is grounded via the switching element 54 by the ON operations of only the switching elements 51 and 54.

In contrast, it is assumed that the drive signal Sa and Sd are in the OFF state and the drive signal Sb and Sc are in the ON state. In this case, the first electric wire W1 connected to the first control unit side terminal T21 is grounded via the resistance R and the switching element 52, and the second electric wire W2 connected to the second control unit side terminal T22 is connected to the battery Va via the switching element 53 by the ON operations of only the switching elements 52 and 53.

Accordingly, the AC signal having a frequency coincident with the resonant frequency f1 is supplied to the LC series resonant circuit (LF antenna) which is composed of the antenna resonant capacitor 11 and the antenna coil 12 so as to be aligned with the ON period of the information signal, so that the antenna coil 12 is driven. Accordingly, the above-described wireless signal is output from the antenna coil 12. The above-described AC signal is supplied also to the LC series resonant circuit composed of the first LED capacitor 13 and the first LED coil 14 and the LC series resonant circuit composed of the second LED capacitor 16 and the second LED coil 17. However, the LEDs 15a and 15b and the LEDs 18a and 18b are not driven because the resonant frequency is not f2 or f3.

Figure 4B:
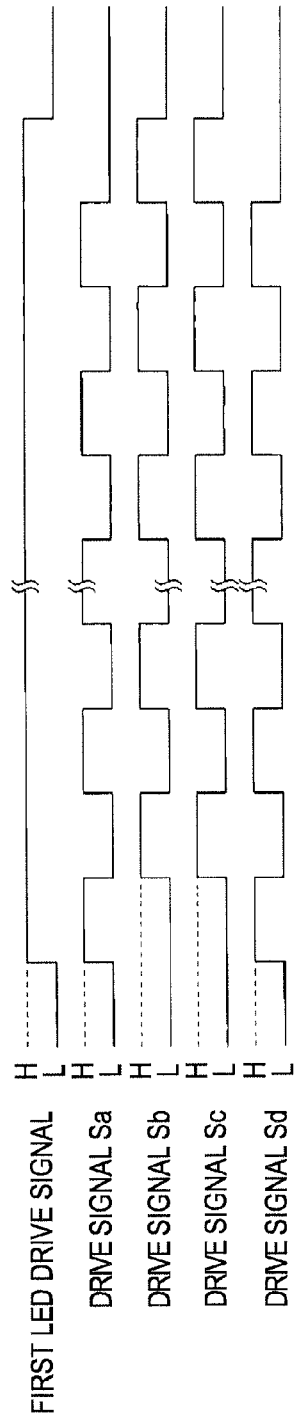
FIG. 4B is a time chart illustrating a first LED drive signal and drive signals.

Alternatively, when the LEDs 15a and 15b are driven, as illustrated in FIG. 4(b), the drive signal Sa and Sd repeat ON and OFF in a pulsed manner at a frequency coincident with the resonant frequency f2 during a ON period of a first LED drive signal which is turned ON and OFF at frequencies sufficiently lower than the resonant frequency f2, and the drive signal Sb and Sc repeat ON and OFF in a pulsed manner so as to be an opposite polarity to that of the drive signal Sa and Sd at the frequency coincident with the resonant frequency f2. Therefore, it is assumed that the drive signal Sa and Sd are in the ON state and the drive signal Sb and Sc are in the OFF state. In this case, the first electric wire W1 connected to the first control unit side terminal T21 is connected to the battery Va via the resistance R and the switching element 51, and the second electric wire W2 connected to the second control unit side terminal T22 is grounded via the switching element 54 by the ON operations of only the switching elements 51 and 54.

In contrast, it is assumed that the drive signal Sa and Sd are in the OFF state and the drive signal Sb and Sc are in the ON state. In this case, the first electric wire W1 connected to the first control unit side terminal T21 is grounded via the resistance R and the switching element 52, and the second electric wire W2 connected to the second control unit side terminal T22 is connected to the battery Va via the switching element 53 by the ON operations of only the switching elements 52 and 53.

Accordingly, the AC signal having the frequency coincident with the resonant frequency f2 is supplied to the LC series resonant circuit composed of the first LED capacitor 13 and the first LED coil 14 so as to align with the ON period of the first LED drive signal, and either one of LED 15a or 15b is driven and turned ON so as to match the polarity of the AC current flowing in the first LED coil 14. The above-described AC signal is supplied also to the LC series resonant circuit composed of the antenna resonant capacitor 11 and the antenna coil 12 and the LC series resonant circuit composed of the second LED capacitor 16 and the second LED coil 17. However, the antenna coil 12 and the LEDs 18a and 18b are not driven because the resonant frequency is not f1 or f3.

Figure 4C:
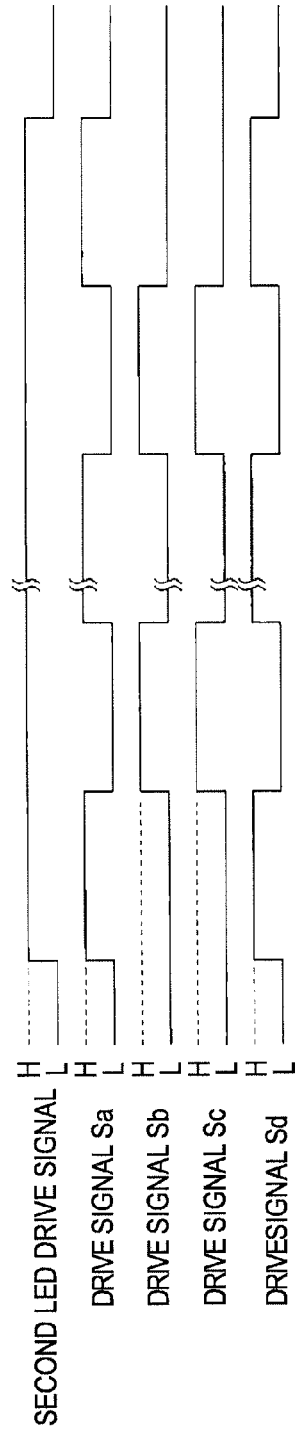
FIG. 4C is a time chart illustrating a second LED drive signal and drive signals.

In addition, when the LEDs 18a and 18b are driven, as illustrated in FIG. 4(c), the drive signal Sa and Sd repeat ON and OFF in a pulsed manner at the frequency coincident with the resonant frequency f3 during a ON period of a second LED drive signal which is turned ON and OFF at frequencies sufficiently lower than the resonant frequency f3, and the drive signal Sb and Sc repeat ON and OFF in a pulsed manner so as to be an opposite polarity to that of the drive signal Sa and Sd at the frequency coincident with the resonant frequency f3. Therefore, it is assumed that the drive signal Sa and Sd are in the ON state and the drive signal Sb and Sc are in the OFF state for example. In this case, the first electric wire W1 connected to the first control unit side terminal T21 is connected to the battery Va via the resistance R and the switching element 51, and the second electric wire W2 connected to the second control unit side terminal T22 is grounded via the switching element 54 by the ON operations of only the switching elements 51 and 54. In contrast, it is assumed that the drive signal Sa and Sd are in the OFF state and the drive signal Sb and Sc are in the ON state. In this case, the first electric wire W1 connected to the first control unit side terminal T21 is grounded via the resistance R and the switching element 52, and the second electric wire W2 connected to the second control unit side terminal T22 is connected to the battery Va via the switching element 53 by the ON operations of only the switching elements 52 and 53.

Accordingly, the AC signal having the frequency coincident with the resonant frequency f3 is supplied to the LC series resonant circuit composed of the second LED capacitor 16 and the second LED coil 17 so as to align with the ON period of the second LED drive signal, and either one of LED 18a or 18b is driven and turned ON so as to match the polarity of the AC current flowing in the second LED coil 17. The above-described AC signal is supplied also to the LC series resonant circuit composed of the antenna resonant capacitor 11 and the antenna coil 12 and the LC series resonant circuit composed of the first LED capacitor 13 and the first LED coil 14. However, the antenna coil 12 and the LEDs 15a and 15b are not driven because the resonant frequency is not f1 or f2.

Here, when any one of the antenna coil 12, the LEDs 15a and 15b, and the LEDs 18a and 18b are driven, the sensor IC 30 is driven by a current rectified by the corresponding diode 44, smoothened in the capacitor 45 and supplied to the power source terminal 34 and the ground terminal 35 as a DC signal. Alternatively, when the drive signal Sa and Sd become the ON state and the drive signal Sb and Sc become the OFF state, the first electric wire W1 is connected to the battery Va and the second electric wire W2 is grounded, and hence the DC signal is supplied to the power source terminal 34 and the ground terminal 35, so that the sensor IC 30 is driven.

Subsequently, the operation of an embodiment disclosed here will be described.

As described above, the antenna coil 12, the LEDs 15a and 15b, and the LEDs 18a and 18b are selectively driven in accordance with the frequency of the AC signal supplied from the drive ECU 50 via the common first and second electric wires W1 and W2. The sensor IC 30 is driven by the DC signal supplied from the drive ECU 50 via the same common first and second electric wires W1 and W2. Then, the sensor IC 30 (lock and unlock sensor 30a) outputs the lock sensing signal or the unlock sensing signal to the drive ECU 50 also via the same common first electric wire W1. Therefore, an electrical connection between the module 10 (the antenna coil 12, the LEDs 15a and 15b, the LEDs 18a and 18b, and the sensor IC 30) and the drive ECU 50 is achieved only with two wires; the first and second electric wires W1 and W2.

In particular, in the sensor IC 30, when the AC drive sensor 30b determines that any one of the antenna coil 12, the LEDs 15a and 15b, and the LEDs 18a and 18b are in a state of being driven, the function of the sensor IC 30 (the lock and unlock sensor 30a) is stopped by the stop control unit 30c. Therefore, the lock and unlock sensor 30a does not perform the sensing action at the same time when any one of the antenna coil 12, the LEDs 15a and 15b, and the LEDs 18a and 18b are in a state of being driven. Since the lock and unlock sensor 30a does not output the lock sensing signal or the unlock sensing signal when any one of the antenna coil 12, the LEDs 15a and 15b, and the LEDs 18a and 18b are in a state of being driven, the probability of erroneous sensing or the like by the sensing signal being superimposed with the AC signal of the first electric wire W1 is reduced.

As described above in detail, the following advantages are achieved according to this embodiment.

(1) In the embodiment disclosed here, even when the electrical connection between the module 10 and the drive ECU 50 is composed of two wires of the first and second electric wires W1 and W2 (multiple communication line), each of the antenna coil 12 the LEDs 15a and 15b, the LEDs 18a and 18b, and the sensor IC 30 may be operated adequately. Then, the number of the wires for electrically connecting between the module 10 and the drive ECU 50 may be reduced, and reduction of size and weight as an entire apparatus is achieved correspondingly, so that cost reduction is achieved.

(2) In the embodiment disclosed here, the drive ECU 50 (the power source supply unit 50b) is capable of generating a plurality of types of AC signals or DC signals having frequencies different from each other in an extremely simple circuit configuration such as controlling the switching actions of the plurality of switching elements 51 to 54.

(3) In the embodiment disclosed here, the terminals needed for electrically connecting the module 10 and the drive ECU 50 are only two on the module 10 side (the first and second module side terminals T11 and T12) and two on the drive ECU 50 side (the first and second control unit side terminals T21 and T22), cost reduction is achieved.

(4) In the embodiment disclosed here, driving of the antenna coil 12, the LEDs 15a and 15b, the LEDs 18a and 18b and the sensor IC 30 is performed by the common power source supply unit 50b of the drive ECU 50 (the switching elements 51 to 54 and the drive circuit 55), and hence the circuit configuration may be simplified and reduction of cost is achieved.

(5) In the embodiment disclosed here, when any one of the antenna coil 12, the LEDs 15a and 15b, and the LEDs 18a and 18b is driven, the sensor IC 30 is driven by a current rectified by the corresponding diode 44, smoothened in the capacitor 45 and supplied as a DC signal. Alternatively, when all of the antenna coil 12, the LEDs 15a and 15b, and the LEDs 18a and 18b are not driven, the sensor IC 30 is driven by the supply of the DC signal from the drive ECU 50 via the first and second electric wires W1 and W2. In this manner, the sensor IC 30 may be maintained in the state of being driven by continuing the supply of the DC signal to the sensor IC 30.

The embodiment described above may be modified as follows.

Figure 5:
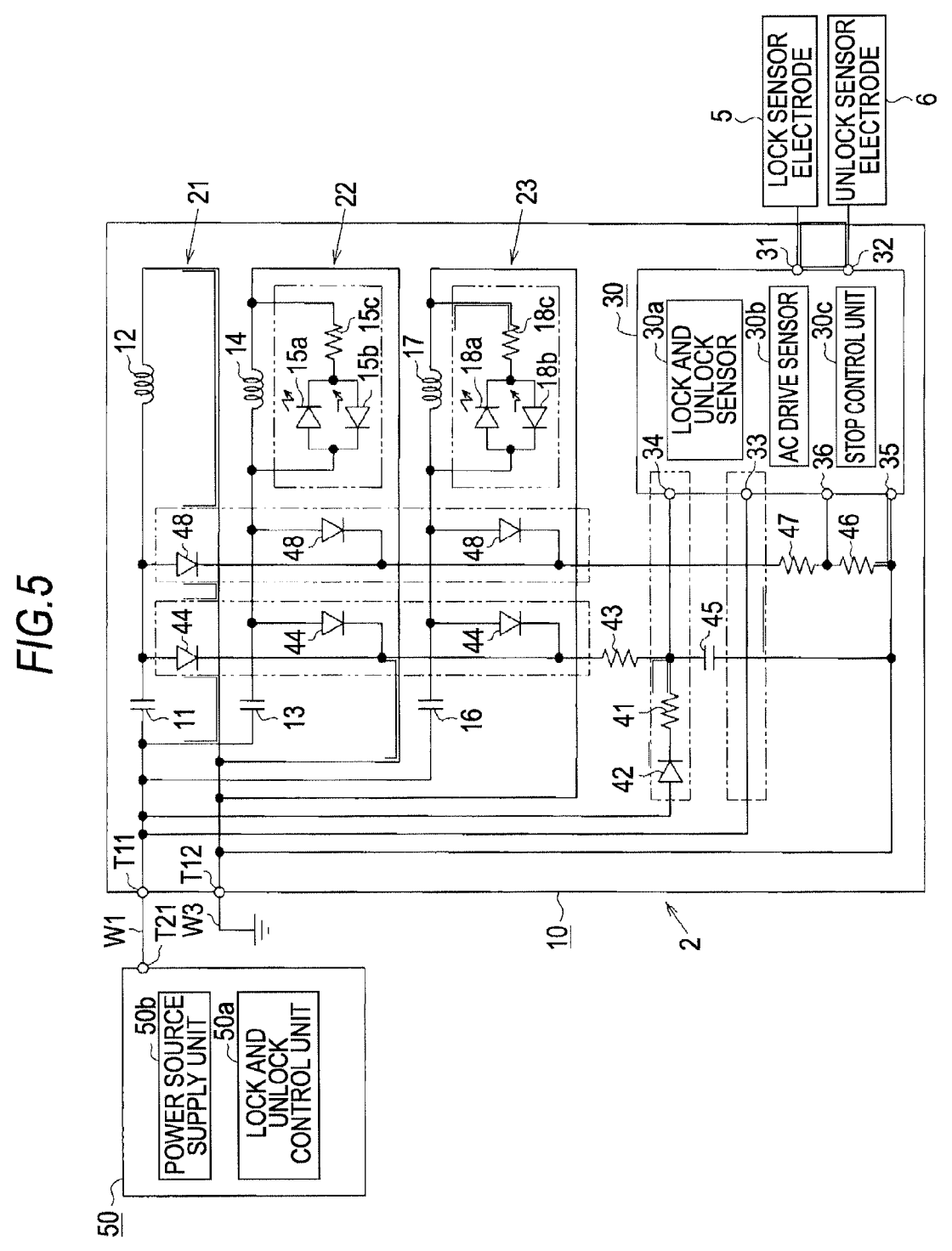

As illustrated in FIG. 5, the second module side terminal T12 of the module 10 may be grounded (for example, the housing grounding by means of the vehicle body) via an electric wire W3 instead of the second electric wire W2. Then, the drive ECU 50 side may be grounded separately from the module 10 in the same manner (for example, the housing grounding by means of the vehicle body). In this case, the second connecting line for electrically connecting the module 10 and the drive ECU 50 is composed of the vehicle body as a housing. Therefore, the electric wire W3 does not have to be laid along the entire part between the module 10 and the drive ECU 50 as the electric wire W2, and hence may be shortened correspondingly, so that further reduction in size and weight as the entire apparatus is achieved.

Figure 6:
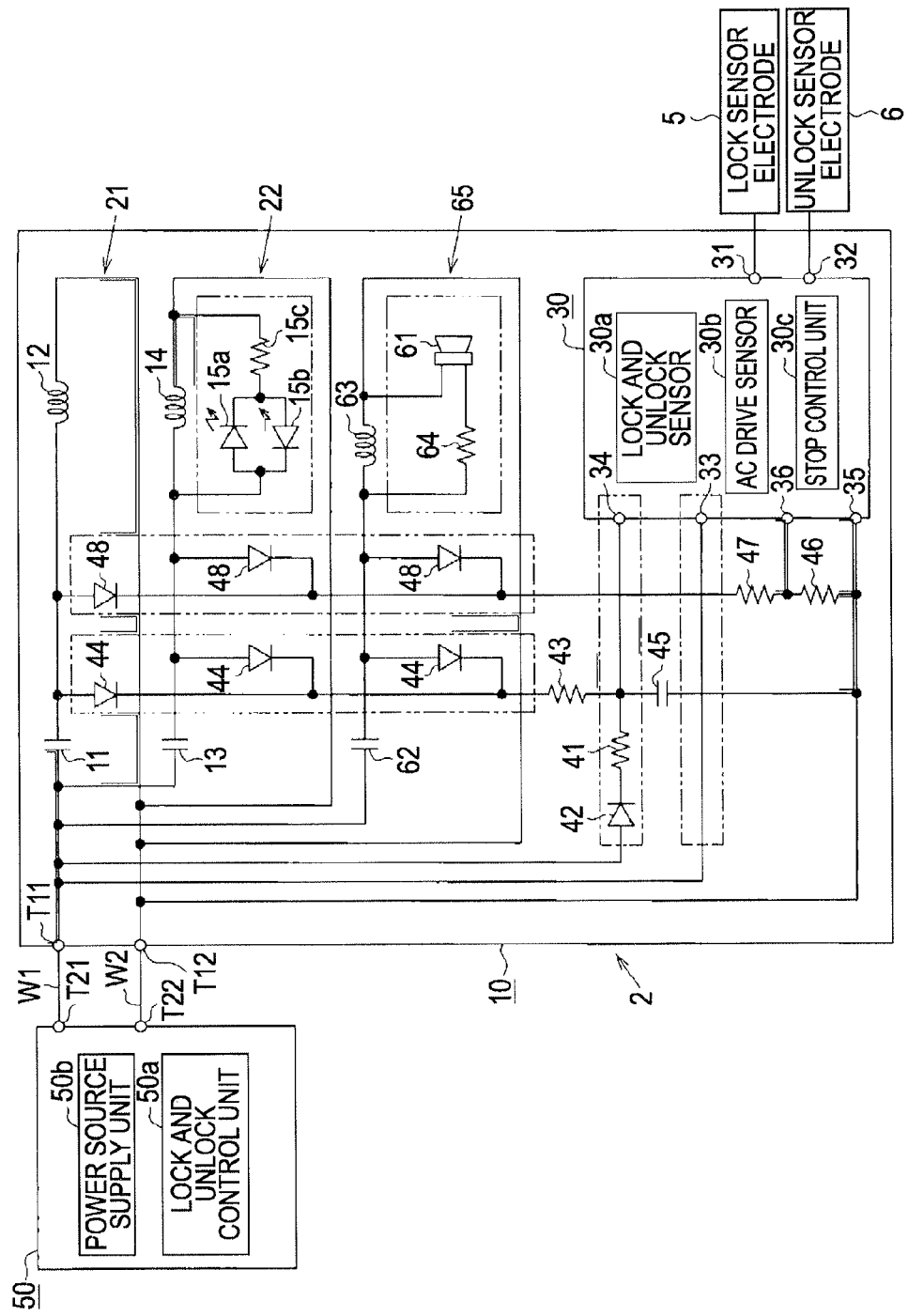
FIG. 6 is a circuit block diagram illustrating an electrical configuration of a modification of the embodiment disclosed here.

As illustrated in FIG. 6, a buzzer 61 may be driven instead of the LEDs 18a and 18b. In other words, the module 10 is provided with a buzzer capacitor 62 connected at one end thereof to the first module side terminal T11, and a buzzer coil 63 connected at one end thereof to the other end of the buzzer capacitor 62. The other end of the buzzer coil 63 is connected to the second module side terminal T12. The buzzer capacitor 62 and the buzzer coil 63 constitute the LC series resonant circuit having a resonant frequency f11 ($\neq$f1, f2) as a third resonant frequency. A series circuit of a resistance 64 and the buzzer 61 is connected to the buzzer coil 63 in parallel. Therefore, when the AC signal having a frequency coincident with the resonant frequency f11 is supplied from the drive ECU 50 via the first and second electric wires W1 and W2, the buzzer 61 is driven. In other words, the buzzer 61 is driven by using a resonant current of the LC series resonance circuit composed of the buzzer capacitor 62 and the buzzer coil 63. The buzzer 61 constitutes a second driven member 65 together with the buzzer capacitor 62 and the buzzer coil 63.

In this case, the LEDs 15a and 15b and the buzzer 61 may be selectively driven by supplying the AC signal having the corresponding resonant frequency. Therefore, notification by light of the LEDs 15a and 15b and notification by the sound of the buzzer 61 may be selectively utilized so as to match the surrounding environment, for example.

The resonant frequency f11 may be brought into coincidence with the resonant frequency f2. In this case, the LEDs 15a and 15b and the buzzer 61 may be driven at the same time by supplying the AC signal having the resonant frequency f2 (f11). Accordingly, the notification by the light of the LEDs 15a and 15b and the notification by the sound of the buzzer 61 may be combined. Then, the state of the vehicle may be indicated to the vehicle user through visual or auditory senses.

Also, the LEDs 15a and 15b, and the first LED capacitor 13 and the first LED coil 14 relating to lighting thereof may be omitted. In this case, only the notification by the sound of the buzzer 61 may be utilized.

In the embodiment described above, one of the LEDs 15a and 15b and the LEDs 18a and 18b, and the circuit relating to the driving thereof may be omitted.

In the embodiment described above, three or more of the LED (or LED pair) driven by frequencies different from each other may be provided. When there are a plurality of the LED driven by the frequencies different from each other, these LEDs may have different emission colors. In this case, the LEDs having different emission colors may be selectively driven. Then, the state of the vehicle may be indicated to the vehicle user through the emission colors. For example, when the emission color is "red", it may indicate that the vehicle door is in the unlocked state, and when the emission color is green, it may indicate that the vehicle door is in the locked state. Alternatively, when the emission color is white, it may be functioned as a welcome light or a footlight.

In the embodiment disclosed here, when at least one LED (or a pair of LEDs) is provided, the state of the vehicle (for example, the unlocked state and the locked state of the vehicle door) may be notified to the vehicle user depending on lighting patterns of the LEDs (flashing, constant lighting, etc.).

In the embodiment disclosed here, when at least one buzzer is provided, the state of the vehicle (for example, the unlocked state and the locked state of the vehicle door) may be notified to the vehicle user depending on sounding pattern of the buzzer (long sound, short sound, etc.).

In the embodiment disclosed here, the required number of the driven members driven by the supply of the AC signal by the drive ECU 50 is at least one. In this case, by combining the L and C of the resonant circuit (LC series resonant circuit), which constitutes the driven member, the corresponding driven member may be driven at a give frequency.

In the embodiment disclosed here, outputs of the respective types of the AC signals to be supplied to the module 10 may be changed by controlling the duty ratio of the switching actions of the switching elements 51 to 54 by the drive ECU 50 (the power source supply unit 50b). In this case, for example, adjustments of the output of the antenna coil 12 (the LF antenna 21), the light-emitting intensities of the LEDs 15a and 15b or the LEDs 18a and 18b, or the volume level of the buzzer 61 are achieved.

In the embodiment disclosed herein, the lock and unlock control unit 50a may be prevented from inputting the lock sensing signal or the unlock sensing signal when the power source supply unit 50b of the drive ECU 50 drives one of the antenna coil 12, the LEDs 15a and 15b, and the LEDs 18a and 18b (or the buzzer 61).

In the embodiment described above, the respective AC signals may be generated so that the cycles corresponding to the frequencies thereof becomes multiples of the cycle corresponding to the frequency of the AC signal which drives the antenna coil 12 (the resonant frequency f1).

In the embodiment disclosed here, the lock sensing signal and the unlock sensing signal may be configured to be identified by difference in voltage level with each other.

In the embodiment disclosed here, the arrangements of the lock sensing area 3 and the unlock sensing area 4 in the outside door handle 2 and arrangements and the shapes of the lock sensor electrode 5 and the unlock sensor electrode 6 corresponding thereto may be changed as needed.

In the embodiment disclosed here, one of sensing of approach or contact of person's hand to the lock sensing area 3 by the lock and unlock sensor 30a and sensing of approach or contact of person's hand to the unlock sensing area 4 may be omitted.

In the embodiment disclosed here, the AC drive sensor 30b of the sensor IC 30 may be configured to sense the driving of the antenna coil 12 or the like by detecting the voltage change of the power source terminal 34, for example.

In the embodiment disclosed here, the AC drive sensor 30b of the sensor IC 30 may be configured to sense the driving of the antenna coil 12 or the like by monitoring the voltage change of the power source terminal 34, for example. Alternatively, the driving of the antenna coil 12 or the like may be sensed by disposing a so-called transformer-coupling coil in the vicinity of the antenna coil 12, the first LED coil 14, and the second LED coil 17 (or the buzzer coil 63) and causing the AC drive sensor 30b of the sensor IC 30 to monitor the AC voltage introduced by these coils.

In the embodiment disclosed here, the sensor IC 30 may be configured to sense the approach or contact of a person by one of or a given combination of a electrostatic capacitance type sensor, a shock sensor, a pyroelectric sensor, a pressure sensor, an infrared sensor, and an RFID.

In the embodiment disclosed here, a wireless signal output from the LF antenna 21 is not limited to an AM modulation and, may be an FM modulation, for example.

In the embodiment disclosed herein, the module 10 may be installed in a vehicle door, in a door knob, in a pillar, in a side mirror, in a cabin or the like.

The embodiment disclosed here may be applied to a so-called tire pressure monitor system (TPMS) configured to sense the air pressure or the temperature of the tire by a wireless communication with a sensor provided in a tire or in the interior of a wheel of the vehicle.

Subsequently, the technical idea understood from the embodiment and other examples described above will be added below.

An antenna drive apparatus having a drive control unit and an antenna electrically connected to the drive control unit via a first connecting line and via a second connecting line, and driven by an AC signal supplied from the drive control unit at a first resonant frequency, including: a first driven member electrically connected to the drive control unit via the first connecting line and via the second connecting line in parallel with the antenna and driven by an AC signal supplied from the drive control unit at a second resonant frequency different from the first resonant frequency; a sensing member electrically connected to the drive control unit via the first connecting line and via the second connecting line in parallel with the antenna and driven by a DC signal supplied from the drive control unit, the sensing member being capable of sensing approach or contact of a person and configured to output a sensing signal indicating the fact that the approach or the contact has been sensed to the drive control unit via the first connecting line; and a stop mechanism configured to stop a function of the sensing member when an AC signal supplied to the antenna or the first driven member is sensed.

In this configuration, the antenna is driven by the AC signal having the first resonant frequency supplied from the drive control unit via the first connecting line and via the second connecting line. At this time, although the AC signal having the first resonant frequency is supplied also to the first driven member from the drive control unit via the first connecting line and via the second connecting line, since the first resonant frequency is different from the second resonant frequency, the first driven member is prevented from being driven.

In contrast, the first driven member is driven by the AC signal having the second resonant frequency supplied from the drive control unit via the first connecting line and via the second connecting line. At this time, although the AC signal having the second resonant frequency is supplied also to the antenna from the drive control unit via the first connecting line and via the second connecting line, since the second resonant frequency is different from the first resonant frequency, the antenna is prevented from being driven.

The sensing member is driven by the DC signal supplied from the drive control unit via the first connecting line and via the second connecting line, and is capable of sensing approach or contact of a person. The sensing member outputs the sensing signal indicating the fact that the approach or the contact has been sensed to the drive control unit via the first connecting line. However, when the AC signal to be supplied to the antenna or the first driven member is sensed, the function of the sensing member is stopped by the stop mechanism. Therefore, the sensing member does not perform a sensing action at the same time when the antenna or the first driven member is driven. In addition, since the sensing member does not output the sensing signal when the antenna or the first driven member is driven, the probability of erroneous sensing or the like by the sensing signal being superimposed with the first connecting line is reduced.

When the DC signal is supplied to the sensing member, the DC signal is supplied also to the antenna and the first driven member. However, the DC signal is cut in the respective resonant circuits (capacitors), and hence the antenna and the first driven member are not driven.

In this manner, even though the number of the connecting lines with respect to the drive control unit is reduced, each of the antenna, the first driven member, and the sensing member may be operated adequately. Then, since the number of the electric wires for electrically connecting with the drive control unit can be reduced, reduction in size and weight as an entire apparatus is achieved correspondingly.

The antenna drive apparatus described above, which further includes a second driven member electrically connected to the drive control unit via the first connecting line and via the second connecting line in parallel with the antenna and driven by an AC signal supplied from the drive control unit at a third resonant frequency different from the first resonant frequency and the second resonant frequency.

In this configuration, even though the second driven member is further provided, the second driven member may be driven adequately with reduced number of connecting lines with respect to the drive control unit.

The antenna drive apparatus described above, wherein the second connecting line is a housing configured to ground the drive control unit and the antenna, the first driven member and the sensing member.

In this configuration, the second connecting line is composed of the housing. Therefore, since the electric wire needs not to be laid over the entire part with respect to the drive control unit as the second connecting line, further reduction in size and weight is achieved as the entire apparatus correspondingly.

According to these configurations, there is provided an antenna drive apparatus capable of reducing the number of connecting lines with respect to a drive control unit without impairing reliability of a sensing member configured to sense approach or contact of a person.

(i) The antenna drive apparatus according to any one of the configurations described above, further including pluralities of LC series resonant circuits and light-emitting diodes as the driven members, wherein the plurality of light-emitting diodes emit emission colors different from each other, and the plurality of the light-emitting diodes are selectively driven by an AC signal having resonant frequencies different from each other as the second resonant frequency supplied to the corresponding LC series resonant circuit from the drive control unit via the first connecting line and via the second connecting line. In this configuration, the plurality of the light-emitting diodes having the emission colors different from each other may be driven selectively.

(ii) The antenna drive apparatus according to any one of the configurations described above, further including an LC series resonant circuit and a light-emitting diode as the driven members, and an LC series resonant circuit and a buzzer as the driven members, wherein the light-emitting diode and the buzzer are selectively driven by an AC signal having resonant frequencies different from each other as the second resonant frequency supplied to the corresponding LC series resonant circuit from the drive control unit via the first connecting line and via the second connecting line. In this configuration, the light-emitting diode and the buzzer may be selectively driven. Therefore, notification by light of the light-emitting diode and notification by the sound of the buzzer may be selectively utilized so as to match the surrounding environment, for example.

(iii) The antenna drive apparatus according to any one of the configurations described above and the above-described (i) and (ii), the drive control unit includes a plurality of switching elements connected to the battery power source and controls the cycle of the switching action of the switching element to change the frequency of the AC signal. In this configuration, the frequency of the AC signal may be changed in an extremely simple circuit configuration such as controlling the switching actions of the plurality of switching elements.

(iv) The antenna drive apparatus according to (iii) described above, wherein the drive control unit changes an output of the AC signal by controlling the duty ratio of the switching actions of the plurality of switching elements. In this configuration, an output of the antenna or the like may be adjusted by changing the output of the AC signal by controlling the duty ratio of the switching actions of the plurality of switching elements by the drive control unit.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An antenna drive apparatus having a drive control unit and an antenna electrically connected to the drive control unit via a first connecting line and via a second connecting line, and driven by an AC signal supplied from the drive control unit at a first resonant frequency, comprising:
   a first driven member electrically connected to the drive control unit via the first connecting line and via the second connecting line in parallel with the antenna and driven by the AC signal supplied from the drive control unit at a second resonant frequency different from the first resonant frequency;
   a sensing member electrically connected to the drive control unit via the first connecting line and via the second connecting line in parallel with the antenna and driven by a DC signal supplied from the drive control unit, the sensing member being capable of sensing approach or contact of a person and configured to output a sensing signal indicating the fact that the approach or the contact has been sensed to the drive control unit via the first connecting line; and
   a stop mechanism configured to stop a function of the sensing member when the AC signal supplied to the antenna or the first driven member is sensed.

2. The antenna drive apparatus according to claim 1, further comprising:
   a second driven member electrically connected to the drive control unit via the first connecting line and via the second connecting line in parallel with the antenna and driven by the AC signal supplied from the drive control unit at a third resonant frequency different from the first resonant frequency and the second resonant frequency.

3. The antenna drive apparatus according to claim 1, wherein
   the second connecting line is a housing configured to ground the drive control unit and the antenna, the first driven member and the sensing member.

* * * * *